US009817208B1

(12) United States Patent
Vinnitsky et al.

(10) Patent No.: US 9,817,208 B1
(45) Date of Patent: Nov. 14, 2017

(54) INTEGRATED CHUCK

(71) Applicant: APPLIED MATERIALS ISRAEL LTD., Rehovot (IL)

(72) Inventors: Efim Vinnitsky, Ashkelon (IL); Samuel Ives Nackash, Nes Ziona (IL); Yohanan Madmon, Kiryat Eqron (IL)

(73) Assignee: APPLIED MATERIALS ISRAEL LTD., Rehovot (IL)

( * ) Notice: Subject to any disclaimer, the term of this patent is extended or adjusted under 35 U.S.C. 154(b) by 0 days.

(21) Appl. No.: 15/271,093

(22) Filed: Sep. 20, 2016

(51) Int. Cl.
| | |
|---|---|
| H01J 37/20 | (2006.01) |
| H01J 37/16 | (2006.01) |
| G03F 7/00 | (2006.01) |
| G02B 7/18 | (2006.01) |
| G01B 11/14 | (2006.01) |
| G01B 9/02 | (2006.01) |
| H01J 37/28 | (2006.01) |

(52) U.S. Cl.
CPC ......... *G02B 7/181* (2013.01); *G01B 9/02049* (2013.01); *G01B 11/14* (2013.01); *H01J 37/20* (2013.01); *H01J 37/28* (2013.01); *H01J 2237/2007* (2013.01)

(58) Field of Classification Search
CPC .. G03F 7/707; G03F 7/70708; G03F 7/70783; G03F 7/7095; G03F 7/70425; G03F 7/70691; G03F 7/70716; G03F 7/70758; G03F 7/70875; G03F 1/00; G03F 9/7003; H01J 37/20; H01J 37/3174; H01J 37/16; H01J 37/18; H01J 37/228; H01J 37/244; H01J 37/26

USPC ............. 355/72, 53, 75, 73, 76; 250/440.11, 250/442.11, 492.2, 311, 307, 441.11, 250/443.1, 491.1, 492.1
See application file for complete search history.

(56) References Cited

U.S. PATENT DOCUMENTS

| | | | | |
|---|---|---|---|---|
| 5,644,137 A | * | 7/1997 | Waggener | H01J 37/20 250/442.11 |
| 6,252,705 B1 | * | 6/2001 | Lo | G12B 5/00 359/383 |
| 6,521,901 B1 | * | 2/2003 | Shamoun | B82Y 10/00 250/440.11 |
| 6,653,639 B1 | * | 11/2003 | Novak | B82Y 10/00 250/442.11 |
| 6,664,549 B2 | * | 12/2003 | Kobayashi | B25B 11/005 250/440.11 |
| 7,119,884 B2 | * | 10/2006 | Ottens | G03F 7/70783 355/72 |
| 7,505,118 B2 | * | 3/2009 | Yang | G03F 7/70425 355/72 |
| 7,532,310 B2 | * | 5/2009 | Mertens | G03F 7/707 355/72 |
| 7,737,419 B2 | * | 6/2010 | Asano | G03F 7/70758 250/442.11 |

(Continued)

*Primary Examiner* — David A Vanore
(74) *Attorney, Agent, or Firm* — Kilpatrick Townsend & Stockton LLP

(57) ABSTRACT

A chuck interface that includes a mirror; an inner surface that is shaped and sized to match a portion of a sidewall of a chuck; wherein the inner surface is mechanically coupled to the mirror; and at least one interfacing element for assisting in attaching the chuck to the mirror; and wherein a difference between a thermal expansion coefficient of the chuck and a thermal expansion coefficient of the mirror does not exceed 0.5 micron*Kelvin per Meter.

14 Claims, 5 Drawing Sheets

(56) References Cited

U.S. PATENT DOCUMENTS

| | | | | |
|---|---|---|---|---|
| 8,603,285 B1* | 12/2013 | Baron | ............... | B82B 3/0047 |
| | | | | 156/272.2 |
| 8,835,847 B2* | 9/2014 | Yaguchi | ............... | H01J 37/20 |
| | | | | 250/311 |
| 9,019,476 B2* | 4/2015 | Compen | ............... | G03F 7/707 |
| | | | | 355/72 |
| 9,508,527 B2* | 11/2016 | Ominami | ............... | H01J 37/16 |
| 2004/0012767 A1* | 1/2004 | Van Elp | ............... | G03F 7/707 |
| | | | | 355/72 |
| 2005/0230637 A1* | 10/2005 | Fukushima | ............... | B82Y 10/00 |
| | | | | 250/443.1 |
| 2011/0101222 A1* | 5/2011 | Wang | ............... | H01J 37/20 |
| | | | | 250/307 |

* cited by examiner

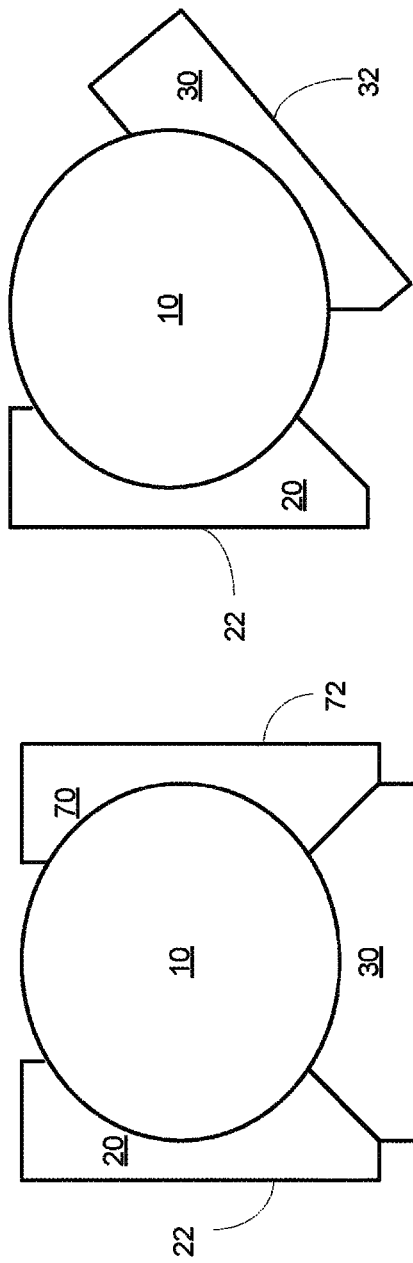
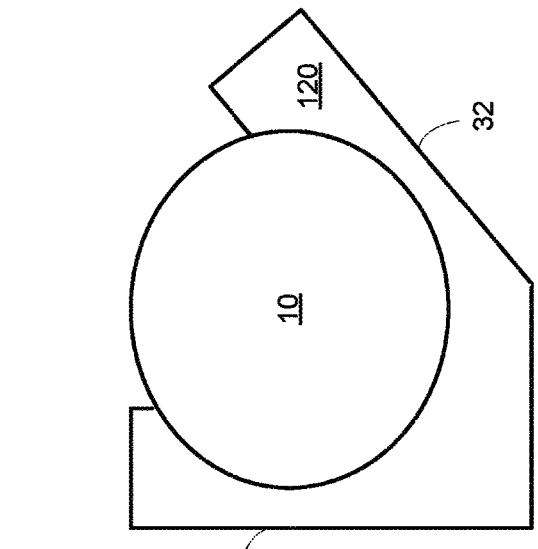
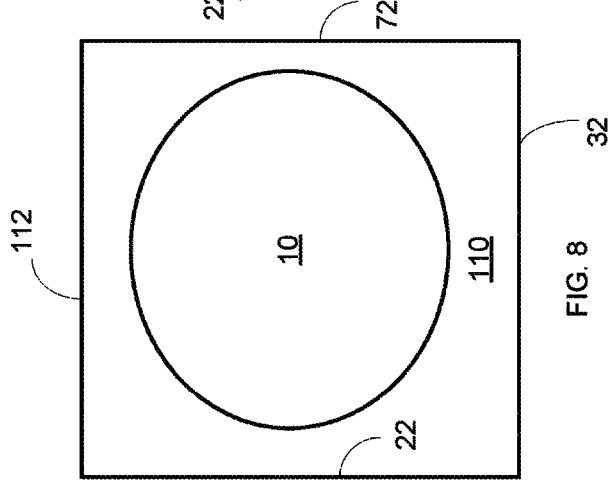
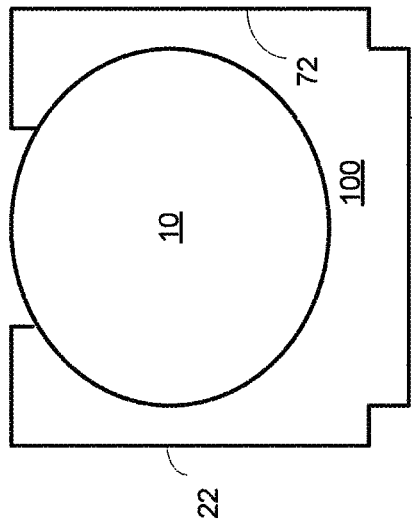

INTEGRATED CHUCK

BACKGROUND OF THE INVENTION

Scanning electron microscopes include a chuck for supporting an inspected object, a mechanical stage for moving the chuck, interferometer mirrors, and an interferometer.

The interferometer mirrors are mechanically coupled to the mechanical stage by a metal coupling element.

The interferometer is configured to illuminate the interferometer mirrors with a laser beam in order to determine the location of the chuck.

The mechanical coupling between the interferometers mirrors and the mechanical stage introduced unpredicted relative movements between the interferometer mirrors and the chuck.

The movement of the mechanical stage heats the mechanical stage, the chuck, the metal coupling element and the interferometer mirrors.

Differences between the thermal expansion coefficients of the chuck, the interferometer mirrors and the metal coupling element cause the interferometers mirrors to be deformed and/or to move in relation to the chuck in an unpredicted manner.

The unpredicted movements and the deformation of the interferometer mirrors introduce an uncertainty in the determination of the location of the chuck.

There is a growing need to provide a device for reducing the uncertainty in the determination of the location of the chuck.

SUMMARY OF THE INVENTION

There may be provided a chuck interface that may include a mirror, an inner surface that is shaped and sized to match a portion of a sidewall of a chuck; wherein the inner surface is mechanically coupled to the mirror; and at least one interfacing element for assisting in attaching the chuck to the mirror. A difference between a thermal expansion coefficient of the chuck and a thermal expansion coefficient of the mirror does not exceed 0.5 micron*Kelvin per Meter. For example—8 micron*Kelvin per Meter versus any value between 7.5 and 8.5 micron*Kelvin per Meter.

The thermal expansion coefficient of the chuck may equal the thermal expansion coefficient of the mirror.

The at least one interfacing element may include multiple spaced apart mounting inserts.

The inner surface may be curved to match a curved sidewall of the chick.

The chuck interface may include a base that is positioned below the inner surface.

The inner surface may be a part of a body of the chuck interface, and the mirror may be glued to the body.

The chuck interface may include an additional mirror that is oriented to the mirror and an additional inner surface that is shaped and sized to match an additional portion of the sidewall of a chuck; and wherein the additional inner surface is mechanically coupled to the additional mirror.

The additional mirror may be oriented to the mirror by ninety degrees.

The additional mirror may be oriented to the mirror by an angle that differs from ninety degrees.

The mirror may be made of BK (borosilicate crown) glass.

The mirror may be made of ceramic Alumina.

The difference between the thermal expansion coefficient of the chuck and a thermal expansion coefficient of the mirror may not exceed 0.2 micron*Kelvin per Meter.

There may be provided a kit that may include a chuck; and a chuck interface that comprises a mirror, an inner surface that is shaped and sized to match a portion of a sidewall of the chuck; wherein the inner surface is mechanically coupled to the mirror, and at least one interfacing element for assisting in attaching the chuck to the mirror; and wherein a difference between a thermal expansion coefficient of the chuck and a thermal expansion coefficient of the mirror does not exceed 0.5 micron*Kelvin per Meter.

There may be provided a kit that may include multiple chuck interfaces. Each chuck interface comprises: a mirror, an inner surface that is shaped and sized to match a portion of a sidewall of the chuck; wherein the inner surface is mechanically coupled to the mirror, and at least one interfacing element for assisting in attaching the chuck to the mirror; and wherein a difference between a thermal expansion coefficient of the chuck and a thermal expansion coefficient of the mirror does not exceed 0.5 micron*Kelvin per Meter.

BRIEF DESCRIPTION OF THE DRAWINGS

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings in which:

FIG. 5 illustrates a chuck and chuck interfaces according to an embodiment of the invention;

FIG. 6 illustrates a chuck and chuck interfaces according to an embodiment of the invention;

FIG. 7 illustrates a chuck and a three-mirror chuck interface according to an embodiment of the invention;

FIG. 8 illustrates a chuck and a four-mirror chuck interface according to an embodiment of the invention; and FIG. 9 illustrates a chuck and a double-mirror chuck interface according to an embodiment of the invention.

DETAILED DESCRIPTION OF EMBODIMENTS

Figure 1:
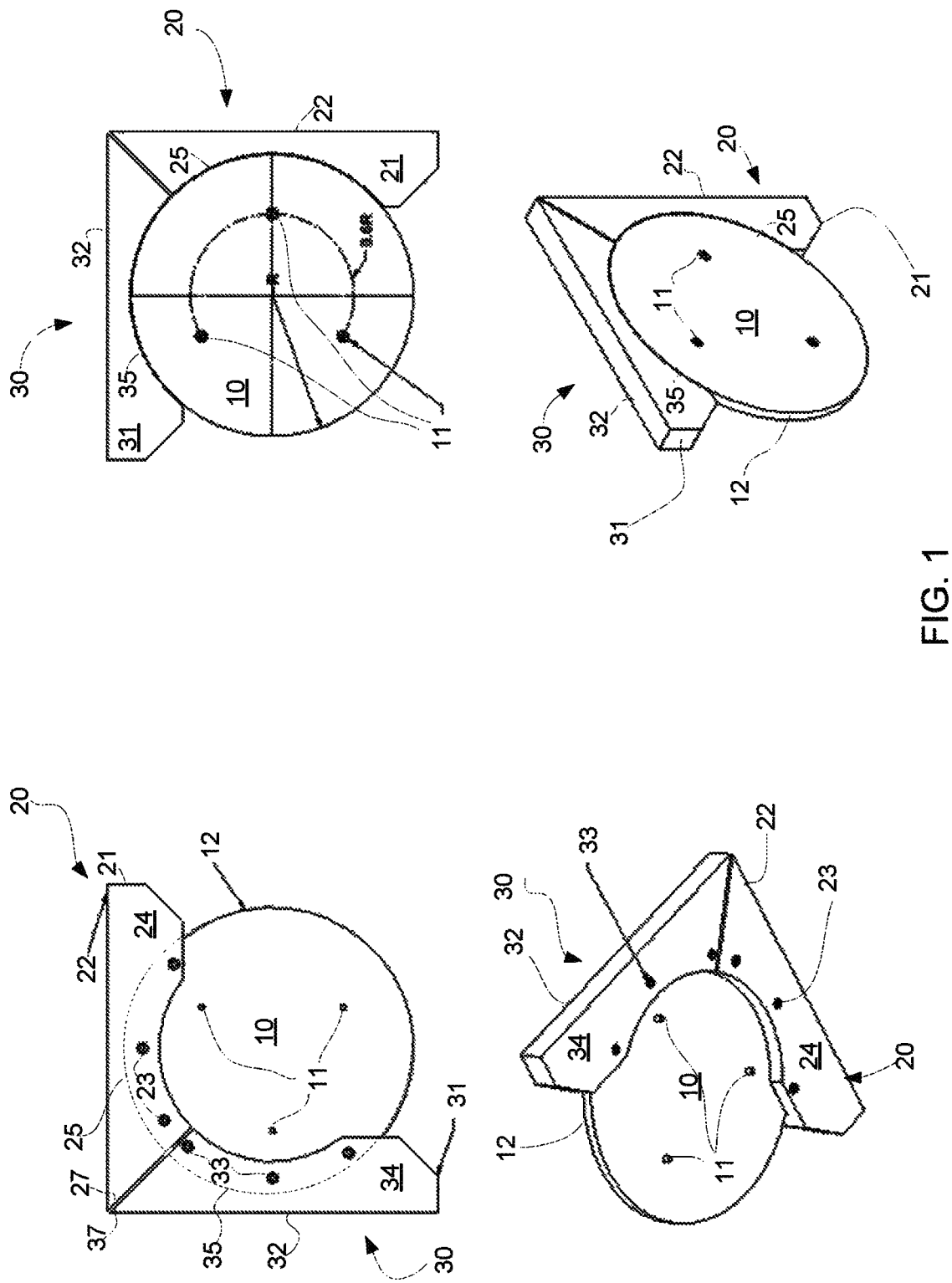
FIG. 1 illustrates a chuck and a pair of chuck interfaces according to an embodiment of the invention.

In the following detailed description, numerous specific details are set forth in order to provide a thorough understanding of the invention. However, it will be understood by those skilled in the art that the present invention may be practiced without these specific details. In other instances, well-known methods, procedures, and components have not been described in detail so as not to obscure the present invention.

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings.

It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

Because the illustrated embodiments of the present invention may for the most part, be implemented using electronic components and circuits known to those skilled in the art, details will not be explained in any greater extent than that considered necessary as illustrated above, for the understanding and appreciation of the underlying concepts of the present invention and in order not to obfuscate or distract from the teachings of the present invention.

Any reference to the term "comprising" or "having" should be interpreted also as referring to "consisting" of "essentially consisting of". For example—a method that comprises certain steps can include additional steps, can be limited to the certain steps or may include additional steps that do not materially affect the basic and novel characteristics of the method—respectively.

There may be provided a chuck interface that may include a mirror, an inner surface and at least one interfacing element.

The inner surface is shaped and sized to match a portion of a sidewall of a chuck. The inner surface is mechanically coupled to the mirror.

The at least one interfacing element is for assisting in attaching the chuck to the chuck interface. The at least one interfacing element, alone or with combination with one or more additional interfacing elements, attach the chuck to the chuck interface.

The difference between a thermal expansion coefficient of the chuck and a thermal expansion coefficient of the mirror may not exceed a predefined value such as 0.5 micron× Kelvin per Meter.

The difference may one exceed 0.3, 0.2 or 0.1 micron× Kelvin per Meter. The difference between the thermal expansion coefficient of the chuck and a thermal expansion coefficient of the mirror may not exceed 10%, 15% or 20% of the thermal expansion coefficient of the chuck.

The chuck and the mirror may be selected so that the thermal expansion coefficient of the chuck and a thermal expansion coefficient of the mirror may differ from each other up to a certain degree. The certain degree may be limited by the allowable temperature induced deformations of the mirror.

Changes in the temperature of the mirror and/or the chuck may cause local deformations of the mirror. The temperature induces local deformations of the mirror may be delimited by an allowable limit such as but not limited 50 nanometers, 100 nanometers 150 nanometers and the like. The allowable changes may be defined based on the required accuracy of the location measurement.

The difference between the thermal expansion coefficients and the mechanical coupling between the mirror and the chuck dramatically reduces the uncertainty introduced in the determination of the location of the chuck.

The inner surface is a part of a body of the chuck interface. The mechanical coupling between the inner surface and the mirror can be achieved by attaching (for example gluing) the mirror to the body of the chuck interface or by forming the mirror as a part of the body of the chuck interface.

The chuck interface may be sold or distributed with a chuck to form a kit.

Figure 2:
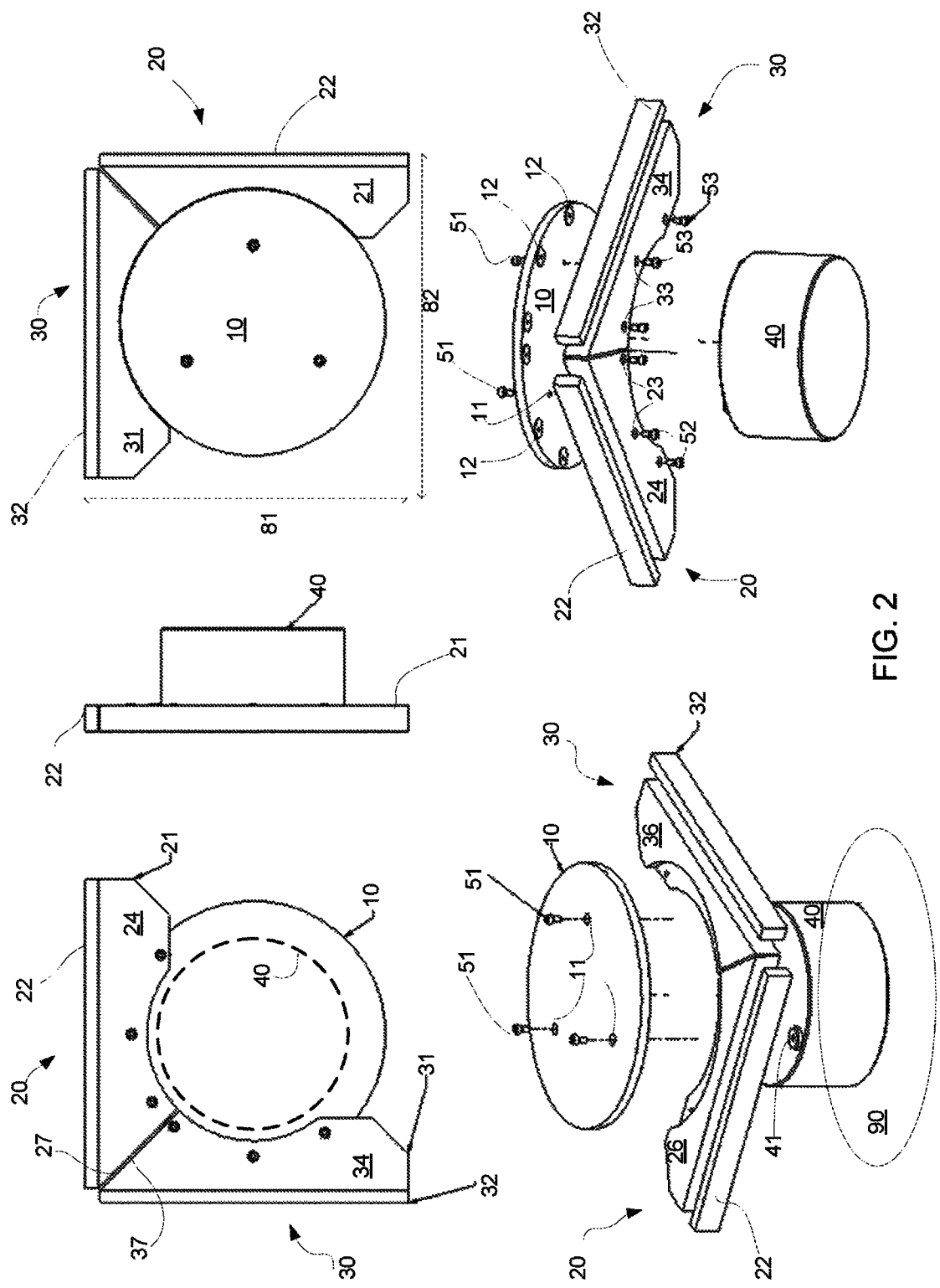
FIG. 2 illustrates a chuck, a mechanical stage and a pair of chuck interfaces according to an embodiment of the invention.

FIGS. 1 and 2 illustrate chuck 10, first chuck interface 20 and second chuck interface 30.

In FIG. 1 the first chuck interface 20 has a first body 21 that may include first mirror 22. In FIG. 2 first body 21 is connected (for example by glue) to first mirror 22 (as illustrated in FIG. 2).

Referring to FIGS. 1 and 2, the first body 21 may include a first base 24, a first inner surface 25, a first upper surface 26 and a first inter-part interface 27.

The first inner surface 25 is curved and is shaped and size to match a part of the sidewall 12 of the chuck 10. For example, if the sidewall 12 is a cylinder of a certain radius (R) then the first inner surface 25 is shaped as an arc and has a radius that slightly exceeds R. Slightly means few (for example less than ten) percent.

The chuck 10 may be positioned on (and supported by) a part of the first base 24.

The first base 24 and the first inner surface 25 may form a curved step that is shaped and sized to contact the chuck 10 while supporting chuck 10.

FIG. 2 illustrates the first mirror 22 as being connected (such as glued) to first body 21—and in this case the glue, the first body 21 and the first mirror 22 should have substantially the same thermal expansion coefficient as the chuck thermal expansion coefficient.

The first mirror 22 can be made of various ceramic materials such as but not limited to ceramic Alumina or BK glass.

The first body 21 may be made of a ceramic material such as but not limited to ceramic Alumina. When the first mirror 22 is an integral part of the first body 21 (see FIG. 1) the ceramic material should function as a mirror—especially after the ceramic material is polished or otherwise processed to provide a flat and non-porous external surface that will be first mirror 22.

The first inter-part interface 27 is for allowing another chuck interface (for example—second chuck interface 30) to be positioned in proximity to chuck 10 and to the first chuck interface 20.

Figure 3:
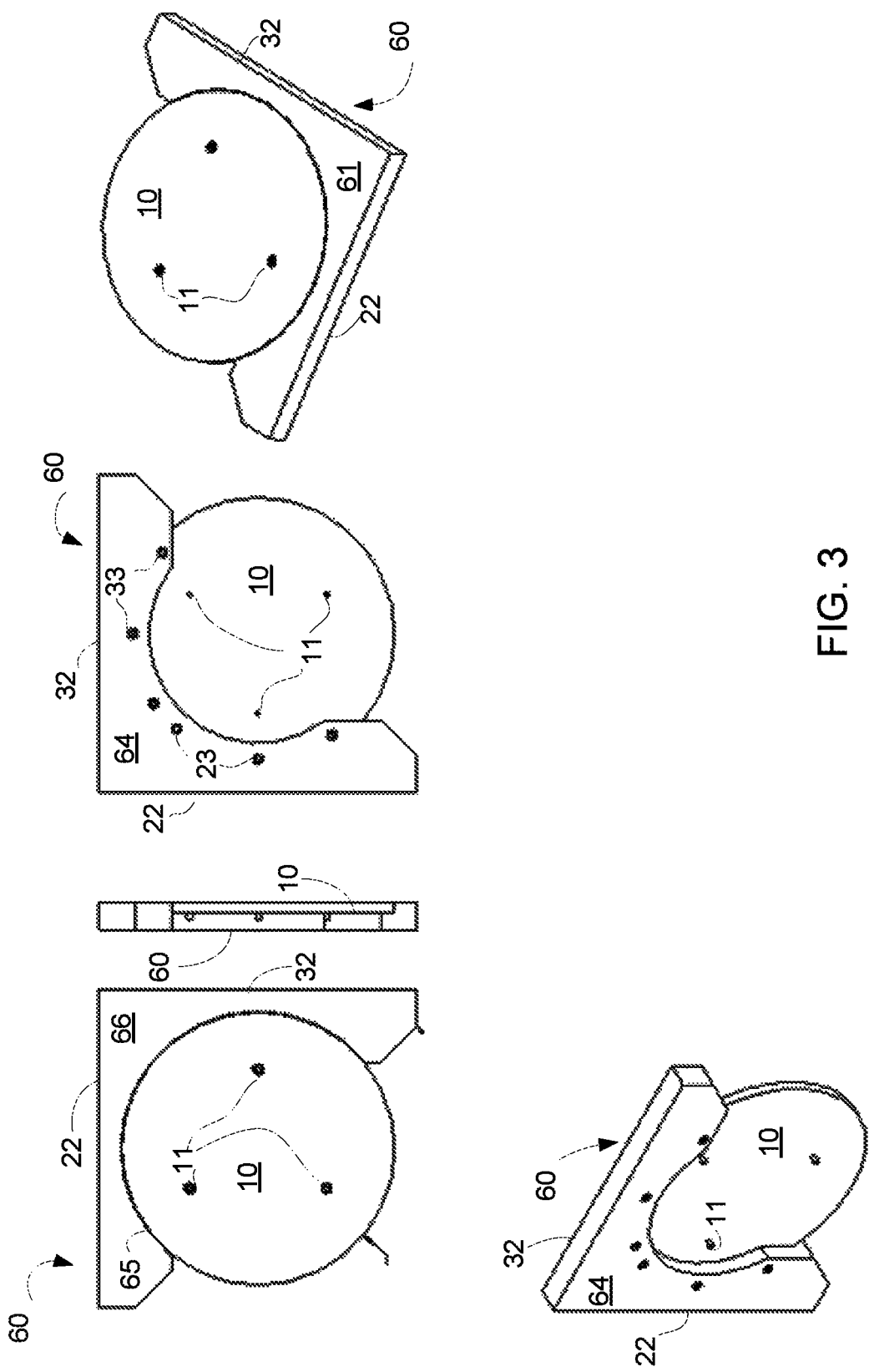
FIG. 3 illustrates a chuck, a mechanical stage and a double-mirror chuck interface according to an embodiment of the invention.

Second chuck interface 30 may have a second body 31 that may include second mirror 32 (as illustrated in FIG. 1). Alternatively, the second body 31 may be connected (for example by glue) to second mirror 32 (as illustrated in FIG. 3).

Referring to FIG. 1, the second body 31 may include a second base 34, a second inner surface 35, a second upper surface 36 and a second inter-part interface 37.

The second inner surface 35 is curved and is shaped and size to match another part of the sidewall 12 of the chuck 10. The chuck 10 may be positioned on (and supported by) a part of the second base 34. The second base 34 and the second inner surface 35 may form a curved step that is shaped and sized to contact the chuck 10 while supporting the chuck 10.

The second inter-part interface 37 is for allowing another chuck interface (for example—first chuck interface 20) to be positioned in proximity to chuck 10 and to the second chuck interface 30.

The second mirror 32 can be made of various ceramic materials such as but not limited to ceramic Alumina or BK glass.

The second body 31 may be made of a ceramic material such as but not limited to ceramic Alumina. When the second mirror 32 is an integral part of the second body 31 (see FIG. 1) the ceramic material should function as a mirror—especially after the ceramic material is polished or otherwise processed to provide a flat and non-porous external surface that will be second mirror 32.

FIG. 2 illustrates the second mirror 32 as being connected (such as glued) to second body 31—and in this case the glue, the second body 31 and the second mirror 32 should have substantially the same thermal expansion coefficient as the chuck thermal expansion coefficient.

It should be noted that in cases where FIG. 2 illustrates a space between first body 21 and first mirror 22 and/or a space between second body 31 and second mirror 32—then this space does not exist after the first mirror 22 is attached to the first body 21 (and after the second mirror 32 is attached to the second body 31). This space mainly emphasizes that the first mirror 22 and the first body 21 (as well as the second mirror 32 and the second body 31) are separate elements—before being connected to each other.

FIG. 1 illustrates chuck 10 as including chuck hollow threaded conduits 11 that are arranged in a radial symmetrical manner at a distance R/2 from the center of chuck 10. R being the radius of chuck 10. The location of the chuck hollow threaded conduits 11, the number of the chuck hollow threaded conduits 11 may differ than those shown in FIG. 1.

FIG. 2 illustrates chuck screws 51 that are screwed in the chuck hollow threaded conduits 11 and within mechanical stage hollow threaded conduit 41 (of mechanical stage 40) thereby fastening the chuck 10 to the mechanical stage 40.

It is noted that mechanical stage 40 can be a Z-axis mechanical stage. The Z-axis mechanical stage may be coupled to another mechanical stage—such as X-Y mechanical stage 90, an R theta mechanical stage and the like.

The chuck 10 can be moved within a chuck plane and also can be elevated or lowered. FIG. 2 shows the length 81 of the first mirror 22 and the length 82 of the second mirror 32. Lengths 81 and 82 should be equal or exceed the range of movement of the chuck within the chuck plane along a first axis and a second axis—during an inspection of the object supported by the chuck.

FIG. 2 further illustrates first threaded holes 23 in which first screws 52 are screwed—in order to attach chuck 10 to the first chuck interface 20.

FIG. 2 further illustrates second threaded holes 33 in which second screws 53 are screwed—in order to attach chuck 10 to the second chuck interface 30.

FIG. 3 illustrates double-mirror chuck interface 60, chuck 10 and a mechanical stage 40.

Double-mirror chuck interface 60 is a combination of first chuck interface 20 and second chuck interface 30 of FIG. 1.

Double-mirror chuck interface 60 includes first mirror 22, second mirror 32, double-mirror chuck interface body 61, double-mirror chuck interface threaded holes 33, double-mirror chuck interface base 64, double-mirror chuck interface inner surface 65 and double-mirror chuck interface upper surface 66.

Double-mirror chuck interface inner surface 65 is curved and is shaped and size to match a part of the sidewall 12 of the chuck 10. The chuck 10 may be positioned on (and supported by) a part of the double-mirror chuck interface base 64. The double-mirror chuck interface base 64 and the double-mirror chuck interface inner surface 65 may form a curved step that is shaped and sized to contact the chuck 10 while supporting chuck 10.

The double-mirror chuck interface body 61 may be made of a ceramic material such as but not limited to ceramic Alumina.

The first mirror 22 is an integral part of the first body 21 and the ceramic material should function as a mirror—especially after the ceramic material is polished or otherwise processed to provide a flat and non-porous external surface that will be first mirror 22.

Figure 4:
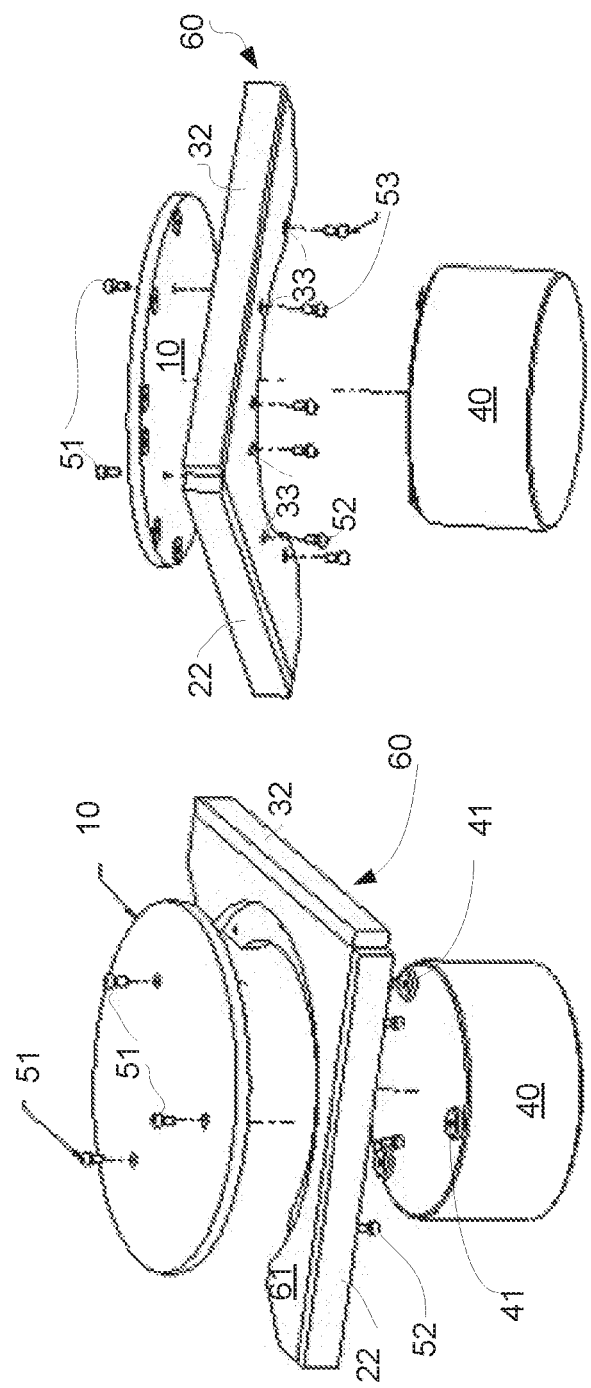
FIG. 4 illustrates a chuck, a mechanical stage and a double-mirror chuck interface according to an embodiment of the invention.

FIG. 4 illustrates double-mirror chuck interface 60, chuck 10 and a mechanical stage 40.

Double-mirror chuck interface 60 is a combination of first chuck interface 20 and second chuck interface 30 of FIG. 2.

Double-mirror chuck interface 60 includes first mirror 22, second mirror 32, double-mirror chuck interface body 61, double-mirror chuck interface threaded holes 63, double-mirror chuck interface base 64, double-mirror chuck interface inner surface 65 and double-mirror chuck interface upper surface 66.

FIG. 4 illustrates the second mirror 32 as being connected (such as glued) to second body 31—and in this case the glue, the second body 31 and the second mirror 32 should have substantially the same thermal expansion coefficient as the chuck thermal expansion coefficient.

FIG. 4 illustrates chuck screws 51 that are screwed in the chuck hollow threaded conduits 11 and within mechanical stage hollow threaded conduit 41 (of mechanical stage 40) thereby fastening the chuck 10 to the mechanical stage 40.

FIG. 4 further illustrates double-mirror chuck interface threaded holes 63 in which first screws 52 and second screws 53 are screwed—in order to attach chuck 10 to the double-mirror chuck interface 60.

FIG. 5 illustrates three chuck interfaces and a chuck according to an embodiment of the invention.

Chuck 10 that interfaces with three chuck interfaces—first chuck interface 20, second chuck interface 30 and third chuck interface 70. All three chuck interfaces are illustrates as being normal to each other—although other orientations may be provided between these three chuck interfaces.

Using three chuck interfaces allows the interferometer to measure yaw and pitch.

Third chuck interface 70 has third mirror 72 that is parallel to first mirror 22 of first chuck interface 20 and is normal to second mirror 32 of second chuck interface 30.

FIG. 6 illustrates first chuck interface 20, second chuck interface 30 and chuck 10 according to an embodiment of the invention.

First chuck interface 20 and second chuck interface 30 are oriented to each other by less that ninety degrees—and first mirror 22 and second mirror 32 are also oriented to each other by less than ninety degrees. This arrangement may be useful when the chuck is moved within the chuck plane along two axes of movement that are not normal to each other.

FIG. 7 illustrates a triple-mirror chuck interface 100 and chuck 10 according to an embodiment of the invention.

The triple-mirror chuck interface 100 is a combination of first chuck interface 20, second chuck interface 30 and third chuck interface 70 of FIG. 5.

Triple-mirror chuck interface 100 includes first mirror 22, second mirror 32 and third mirror 72.

FIG. 8 illustrates a four-mirror chuck interface 110 and chuck 10 according to an embodiment of the invention.

Four-mirror chuck interface 110 surrounds the chuck 10 from all sides of chuck 10 and include four mirrors (first mirror 22, second mirror 32, third mirror 72 and fourth mirror 112) that are normal to each other. The four mirrors may be oriented to each other by other angles. The four-mirror chuck interface 110 may be replaced by four chuck interfaces that include a single mirror each, by two double-mirror chuck interfaces or by a combination of a double-mirror chuck interface and two single-mirror chuck interfaces.

FIG. 9 illustrates double-mirror chuck interface 120 and chuck 10 according to an embodiment of the invention. Double-mirror chuck interface 120 includes first mirror 22 and second mirror 32 that are oriented in relation to each other by less than ninety degrees. Double-mirror chuck interface 120 is a combination of first chuck interface 20 and second chuck interface 30 of FIG. 6.

It should be noted that although FIGS. 5-9 illustrate chuck mirrors that part of the bodies of the chuck interfaces that any of these chuck interfaces may include mirrors that are glued or otherwise connected to the bodies of the chuck interfaces.

In FIGS. 1-9 the following reference numbers refer to:

| Reference Number | Description |
| --- | --- |
| 10 | Chuck |
| 11 | Chuck hollow threaded conduit |
| 12 | Chuck sidewall |
| 20 | First chuck interface |
| 21 | First chuck interface body |
| 22 | First mirror |
| 23 | First threaded hole |
| 24 | First base |
| 25 | First inner surface |
| 26 | First upper surface |
| 27 | First inter-part interface |
| 30 | Second chuck interface |
| 31 | Second chuck interface body |
| 32 | Second mirror |
| 33 | Second threaded hole |
| 34 | Second base |
| 35 | Second inner surface |
| 36 | Second upper surface |
| 37 | Second inter-part interface |
| 40 | Mechanical stage |
| 41 | Mechanical stage hollow threaded conduit |
| 51 | Chuck screws |
| 52 | First screws |
| 53 | Second screws |
| 60 | Double-mirror chuck interface |
| 61 | Double-mirror chuck interface body |
| 64 | Double-mirror chuck interface base |
| 65 | Double-mirror chuck interface inner surface |
| 66 | Double-mirror chuck interface upper surface |
| 70 | Third chuck interface |
| 72 | Third mirror |
| 81 | Length of first mirror |
| 82 | Length of second mirror |
| 90 | X-Y mechanical stage |
| 100 | Three-mirror chuck interface |
| 110 | Four-mirror chuck interface |
| 112 | Fourth mirror |
| 120 | Dual-mirror chuck interface |

In the foregoing specification, the invention has been described with reference to specific examples of embodiments of the invention. It will, however, be evident that various modifications and changes may be made therein without departing from the broader spirit and scope of the invention as set forth in the appended claims.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Any arrangement of components to achieve the same functionality is effectively "associated" such that the desired functionality is achieved. Hence, any two components herein combined to achieve a particular functionality may be seen as "associated with" each other such that the desired functionality is achieved, irrespective of architectures or intermedial components. Likewise, any two components so associated can also be viewed as being "operably connected," or "operably coupled," to each other to achieve the desired functionality.

Furthermore, those skilled in the art will recognize that boundaries between the above described operations merely illustrative. The multiple operations may be combined into a single operation, a single operation may be distributed in additional operations and operations may be executed at least partially overlapping in time. Moreover, alternative embodiments may include multiple instances of a particular operation, and the order of operations may be altered in various other embodiments.

However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps then those listed in a claim. Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

While certain features of the invention have been illustrated and described herein, many modifications, substitutions, changes, and equivalents will now occur to those of ordinary skill in the art. It is, therefore, to be understood that the appended claims are intended to cover all such modifications and changes as fall within the true spirit of the invention.

We claim:

1. A chuck interface, comprising:
    a mirror;
    an inner surface that is shaped and sized to match a portion of a sidewall of a chuck; wherein the inner surface is mechanically coupled to the mirror; and
    at least one interfacing element for assisting in attaching the chuck to the mirror; and wherein a difference between a thermal expansion coefficient of the chuck and a thermal expansion coefficient of the mirror does not exceed 0.5 micron*Kelvin per Meter.

2. The chuck interface according to claim 1, wherein the thermal expansion coefficient of the chuck equals the thermal expansion coefficient of the mirror.

3. The chuck interface according to claim 1, wherein the at least one interfacing element comprises multiple spaced apart mounting inserts.

4. The chuck interface according to claim 1, wherein the inner surface is curved to match a curved sidewall of the chick.

5. The chuck interface according to claim 4, further comprising a base that is positioned below the inner surface.

6. The chuck interface according to claim 1, wherein the inner surface is a part of a body of the chuck interface, and wherein the mirror is glued to the body.

7. The chuck interface according to claim 1 comprising an additional mirror that is oriented to the mirror and an additional inner surface that is shaped and sized to match an additional portion of the sidewall of a chuck; and wherein the additional inner surface is mechanically coupled to the additional mirror.

8. The chuck interface according to claim 7 wherein the additional mirror is oriented to the mirror by ninety degrees.

9. The chuck interface according to claim 7 wherein the additional mirror is oriented to the mirror by an angle that differs from ninety degrees.

10. The chuck interface according to claim 1, wherein the mirror is made of borosilicate crown glass.

11. The chuck interface according to claim 1, wherein the mirror is made of ceramic Alumina.

12. The chuck interface according to claim 1 wherein the difference between the thermal expansion coefficient of the chuck and a thermal expansion coefficient of the mirror does not exceed 0.2 micron*Kelvin per Meter.

13. A kit comprising:
a chuck; and
a chuck interface that comprises a mirror, an inner surface that is shaped and sized to match a portion of a sidewall of the chuck; wherein the inner surface is mechanically coupled to the mirror, and at least one interfacing element for assisting in attaching the chuck to the mirror; and
wherein a difference between a thermal expansion coefficient of the chuck and a thermal expansion coefficient of the mirror does not exceed 0.5 micron*Kelvin per Meter.

14. A kit comprising:
a chuck; and
a plurality of chuck interfaces, each chuck interface in the plurality of chuck interfaces comprising: a mirror, an inner surface that is shaped and sized to match a portion of a sidewall of the chuck; wherein the inner surface is mechanically coupled to the mirror, and at least one interfacing element for assisting in attaching the chuck to the mirror; and
wherein a difference between a thermal expansion coefficient of the chuck and a thermal expansion coefficient of the mirror does not exceed 0.5 micron*Kelvin per Meter.

* * * * *